(12) United States Patent
Laurent

(10) Patent No.: US 6,717,865 B2
(45) Date of Patent: Apr. 6, 2004

(54) VOLTAGE DETECTION CIRCUIT AND METHOD FOR SEMICONDUCTOR MEMORY DEVICES

(75) Inventor: Duane Giles Laurent, Lewisville, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/125,210

(22) Filed: Apr. 17, 2002

(65) Prior Publication Data

US 2003/0198088 A1 Oct. 23, 2003

(51) Int. Cl.[7] ................................................ G11C 7/00
(52) U.S. Cl. .................. 365/189.06; 365/201; 365/226; 327/205
(58) Field of Search ........................... 365/189.06, 201, 365/226; 327/205

(56) References Cited

U.S. PATENT DOCUMENTS

| | | | | |
|---|---|---|---|---|
| 5,703,512 A | * | 12/1997 | McClure | 327/198 |
| 5,804,996 A | * | 9/1998 | Verhaeghe et al. | 327/77 |
| 6,046,617 A | * | 4/2000 | Hoeld | 327/206 |
| 6,181,172 B1 | * | 1/2001 | Callahan | 327/143 |
| 6,549,048 B2 | * | 4/2003 | Tailliet | 327/205 |

OTHER PUBLICATIONS

Laurent, "Sense Amplifier Signal Margins and Process Sensitivities"; *IEEE Transactions on Circuits and Systems*—I: Fundamental Theory and Applications; vol. 49, No. 3; Mar. 2002; pp. 269–275.

Geib, et al., "Experimental Investigation of the Minimum Signal for Reliable Operation of DRAM Sense Amplifiers"; *IEEE Journal of Solid-State Circuits*, vol. 27, No. 7; Jul. 1992; pp. 1028–1035.

* cited by examiner

*Primary Examiner*—Hoai Ho
(74) *Attorney, Agent, or Firm*—Lisa K. Jorgenson; Andre Szuwalski

(57) ABSTRACT

A circuit is disclosed for monitoring a reference voltage generated in a semiconductor memory device to facilitate a memory access operation. The circuit utilizes a pair of Schmitt trigger circuits. A first of the Schmitt trigger circuits detects the voltage appearing on the output of a reference voltage generator falling below a minimum threshold voltage level. A second of the Schmitt trigger circuits detects the output voltage of the reference voltage generator exceeding a maximum threshold voltage level. The circuit may further include reset circuitry for initially placing predetermined voltage levels on the inputs of the Schmitt trigger circuits. An output circuit receives the output of each Schmitt trigger circuit and generates an output signal having a value indicative of whether the output of the reference voltage generator is not within an acceptable voltage range.

36 Claims, 3 Drawing Sheets

VOLTAGE DETECTION CIRCUIT AND METHOD FOR SEMICONDUCTOR MEMORY DEVICES

BACKGROUND OF THE INVENTION

1. Technical Field of the Invention

The present invention relates to voltage detection circuitry, and particularly to detecting intermediate reference voltages utilized by memory devices during memory access operations.

2. Description of the Related Art

Dynamic random access memory (DRAM) devices are known to store a single data value as a charge maintained on a memory cell capacitor. An addressed memory cell is accessed by coupling the memory cell capacitor to a bit line, the voltage of which is then sensed by a sense amplifier. The sense amplifier amplifies the voltage on the bit line so that the bit line may be effectively received by input/output circuitry and provided to an external data output pin of the memory device.

In particular, the sense amplifier senses the voltage appearing on a bit line by sensing the voltage differential appearing across a pair of bit lines. A first bit line of the bit line pair is coupled to the addressed memory cell and maintains a voltage/charge representative of the data value stored in the addressed memory cell. The charge appearing on the memory cell capacitor is shared with the charge appearing on the bit line. A second bit line of the bit line pair is set to a reference voltage level by a reference memory cell having a voltage level between a voltage level corresponding to a logic high value and a voltage level corresponding to a logic low value.

Because the capacitance of a memory cell capacitor is markedly smaller than the capacitance of a bit line, it is important to ensure that the bit lines are initially at the same voltage and that the bit line voltage does not vary from bit line to bit line. Accordingly, DRAM devices typically employ equilibrate circuitry to initially short together the bit lines of the bit line pairs and precharge circuitry to drive the bit lines to a desired voltage level at the beginning of each memory access operation. The precharge circuitry may typically include or otherwise utilize a reference generator that generates an output signal at the desired voltage level.

In order to get the largest capacitance in the smallest possible area, the oxide of a DRAM memory cell capacitor must be extremely thin. Since voltages as small as a few volts can weaken or even destroy these thin oxides, it is important that the voltage across the capacitors' terminals not exceed a predefined critical value. Since one terminal of the capacitor must vary between logic low and logic high voltage levels, depending on the data being written into the cell at the time, the voltage appearing on the other capacitor terminal must be at some intermediate voltage level and must be held relatively constant. Accordingly, DRAM devices typically employ a reference generator that generates an output signal at this intermediate level.

The differential nature of sense amplifiers requires that reference memory cells be used to provide a voltage against which memory cell voltages can be compared. Because memory cells are written with either low logic levels or high logic levels, an intermediate voltage level is required for these reference memory cells. Accordingly, DRAM devices also employ a reference generator that generates an output signal at this intermediate level.

With supply voltages ever decreasing, the difference between voltages representing logic high and logic low values continues to decrease. The decrease in supply voltage levels makes it more important to ensure that each aforementioned intermediate and/or desired voltage levels is maintained close to its predetermined value. Failure to do so can result either in yield loss, if the DRAM device fails functional tests, or in long-term reliability failure, if the DRAM device fails in the users' application. As a result, existing DRAM devices have employed test circuitry for determining whether these reference generator circuits operate within acceptable limits, i.e., whether the bit lines, reference cells and plate connections are maintained at voltage levels appropriate for normal operation. The test circuitry typically includes a differential amplifier/comparator circuit for comparing the output of the generator circuitry with a test signal, often provided by a bandgap circuit. This test circuitry, however, is overly complex for the purpose of testing reference generator circuitry for generating intermediate voltage levels and thereby occupies an appreciable amount of space in conventional DRAM devices.

Based upon the foregoing, there is a need for more effectively testing the operation of precharge circuitry within semiconductor memory devices.

SUMMARY OF THE INVENTION

Embodiments of the present invention overcome the above-identified shortcoming associated with existing test circuitry and satisfy a significant need for a detection circuit for detecting whether reference generator circuitry within a memory device, such as a DRAM device, no longer generates an intermediate reference voltage within a desired range of voltage levels. Instead of utilizing relatively complex differential amplifier circuitry, an embodiment of the present invention may utilize a pair of Schmitt trigger circuits to determine whether the intermediate voltage generated by the reference generator exceeds a maximum threshold voltage level and falls below a minimum threshold voltage level. The detection circuit may include reset circuitry coupled between the output of the reference generator and the input of each Schmitt trigger circuit, for selectively and temporarily placing the input of the Schmitt trigger circuits at logic high and logic low values, before the detection circuit performs voltage detection.

In the event the output of the reference generator circuitry thereafter falls below the minimum threshold voltage level, an output of a first of the Schmitt trigger circuits changes logic values, which thereupon causes an output of the detection circuit to change state. In the event the output of the reference generator exceeds the maximum threshold voltage level, an output of a second of the Schmitt trigger circuits changes logic values, which thereupon causes the output of the detection circuit to change state. In this way, the output of the reference generator may be monitored in an efficient and relatively simple manner.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE EXEMPLARY EMBODIMENTS

The present invention will now be described more fully hereinafter with reference to the accompanying drawings in which exemplary embodiments of the invention are shown. This invention may, however, be embodied in many different forms and should not be construed as being limited to the embodiments set forth herein. Rather, the embodiments are provided so that this disclosure will be thorough and complete, and will fully convey the scope of the invention to those skilled in the art.

Figure 1:
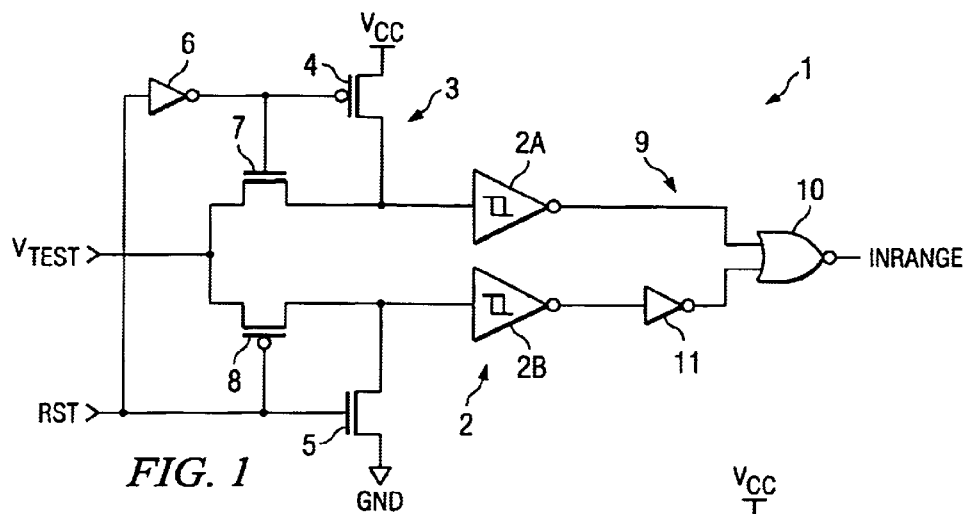
FIG. 1 is a schematic diagram of a detection circuit according to an exemplary embodiment of the present invention.

Referring to FIG. 1, there is shown a detection circuit 1 according to an exemplary embodiment of the present invention. Detection circuit 1 is capable of monitoring the voltage level of a signal and detecting the voltage level no longer being within a predetermined range of voltage levels. Detection circuit 1 may be used in a memory device, such as a dynamic random access memory device, to monitor voltage levels of voltage generator circuitry employed to precharge bit lines of the memory device, charge a plate of memory cell capacitors and/or store a voltage level in reference memory cells. It is understood, however, that detection circuit 1 may be used to monitor voltage levels generated within other integrated circuits, such as nonvolatile memory devices.

Detection circuit 1 may include a pair of Schmitt trigger circuits 2. An input of each Schmitt trigger circuit 2 may be coupled to the signal to be monitored. A first Schmitt trigger circuit 2A may be adapted to detect whether an input to detection circuit 1 falls below a minimum threshold voltage level. A second Schmitt trigger circuit 2B may be adapted to detect whether the input to detection circuit 1 rises above a maximum threshold voltage level. In this way, a desired range of voltage levels may be defined between maximum and minimum threshold voltage levels such that first and second Schmitt trigger circuits 2 detect when the input of detection circuit 1 is no longer within the desired voltage range.

Figure 2:
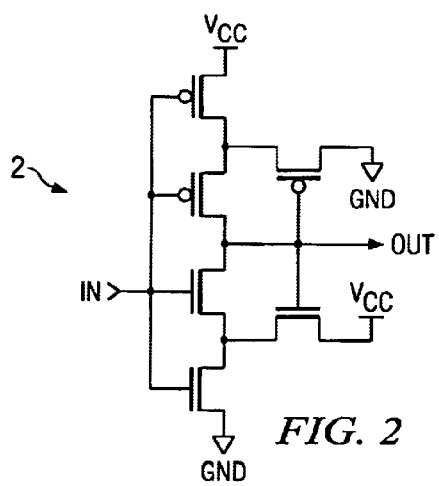
FIG. 2 is a schematic diagram of a Schmitt trigger circuit shown in FIG. 1.

Schmitt trigger circuits 2 of detection circuit 1 may be Schmitt trigger logic inverters. Each Schmitt trigger circuit 2 includes a hysteresis effect inherent in Schmitt trigger circuits. For each Schmitt trigger circuit 2, the input voltage Vih (hereinafter the "input switching voltage Vih") at which the output of each Schmitt trigger circuit 2 switches from a logic high value to a logic low value is not the same as the input voltage Vil (hereinafter the "input switching voltage Vil") at which the output of each Schmitt trigger circuit 2 switches from a logic low value to a logic high value. In particular, input switching voltage Vih is greater than input switching voltage Vil by a predetermined amount. An implementation of Schmitt trigger circuits 2 is shown in FIG. 2. Input switching voltages Vih and Vil are derived based upon the dimensions of the transistors forming Schmitt trigger circuit 2. It is understood other transistor circuit implementations for Schmitt trigger circuits 2 may be utilized.

Detection circuit 1 may include reset circuitry 3 for temporarily placing the input of each Schmitt trigger circuit 2 in an initial logic state prior to detection circuit 1 performing a voltage detection operation. The reset circuitry 3 may place the input of Schmitt trigger circuit 2A in a logic high state and the input of Schmitt trigger circuit 2B in a logic low state. Referring to FIG. 1, reset circuitry 3 may include a pull-up transistor 4 coupled between the input of Schmitt trigger circuit 2A and a high reference voltage (Vcc) and a pull-down transistor 5 coupled between the input of Schmitt trigger circuit 2B and a low reference voltage, such as the ground reference. Pull-up transistor 4 may be a p-channel field effect transistor, but it is understood that pull-up transistor 4 may be other transistor types that, when activated, allow the input of Schmitt trigger circuit 2A to be pulled to the high reference voltage Vcc. Likewise, pull-down transistor 5 may be an n-channel field effect transistor, but it is understood that pull-down transistor 5 may be other transistor types that, when activated, allow the input of Schmitt trigger circuit 2B to be pulled to the low reference voltage.

Detection circuit 1 may include a reset input signal RST which, when asserted, triggers reset circuitry 3 to reset the input of Schmitt trigger circuits 2 in the above-identified initial logic states. The control terminal of pull-up transistor 4 may be coupled to reset input signal RST via logic inverter 6. The control terminal of pull-down transistor 5 may be coupled to reset input signal RST. In this way, when reset input signal RST is at a logic high state, pull-up transistor 4 and pull-down transistor 5 are activated (turned on); and when reset input signal RST is at a logic low state, pull-up transistor 4 and pull-down transistor 5 are deactivated (turned off).

Reset circuitry 3 may further include components for isolating the input signal of detection circuit 1, in this case input signal Vtest, from Schmitt trigger circuits 2 during the time reset circuitry 3 places the input thereof in the logic high and low states. In particular, reset circuitry may include a transistor 7 coupled between input signal Vtest and the input of Schmitt trigger circuit 2A, and a transistor 8 coupled between input signal Vtest and the input of Schmitt trigger circuit 2B. Although transistors 7 and 8 are depicted in FIG. 1 as n-channel and p-channel field effect transistors, respectively, it is understood that transistors 7 and 8 may be other types of transistors as well. The control terminal of transistor 7 may be coupled to logic inverter 6 (i.e., the logical inversion of reset input signal RST) and the control terminal of transistor 8 may be coupled to reset input signal RST. Consequently, transistors 7 and 8 are deactivated when reset input signal RST activates pull-up transistor 4 and pull-down transistor 5, and activated when reset input signal RST deactivates pull-up transistor 4 and pull-down transistor 5.

Detection circuit 1 may further include output circuitry 9 having inputs coupled to the output of Schmitt trigger circuits 2 and which generates an output signal INRANGE having a value indicative of whether the voltage of input signal Vtest is no longer within the predetermined voltage range defined by input switching voltages Vih and Vil. Referring to FIG. 1, output circuitry 9 may include a logic gate 10, such as a logic NOR gate, having a first input coupled to an output of Schmitt trigger circuit 2A and a second input coupled to an output of Schmitt trigger circuit 2B. Logic inverter 11 may be coupled between the output of Schmitt trigger circuit 2B and logic gate 10. In this way, output signal INRANGE is at a logic high value during the time input signal Vtest remains within the predetermined voltage range, and transitions to a logic low value when the voltage of input signal Vtest is no longer within the predetermined voltage range.

It is understood that output circuitry 10 may be implemented with other logic gates. For instance, logic gate 10 may be a logic OR gate, whereby output signal INRANGE is a logical inversion of output signal INRANGE of FIG. 1. Alternatively, logic gate 10 may be a logic AND gate and logic inverter 11 may be disposed between the output of Schmitt trigger circuit 2A and logic gate 10.

Figure 3A:
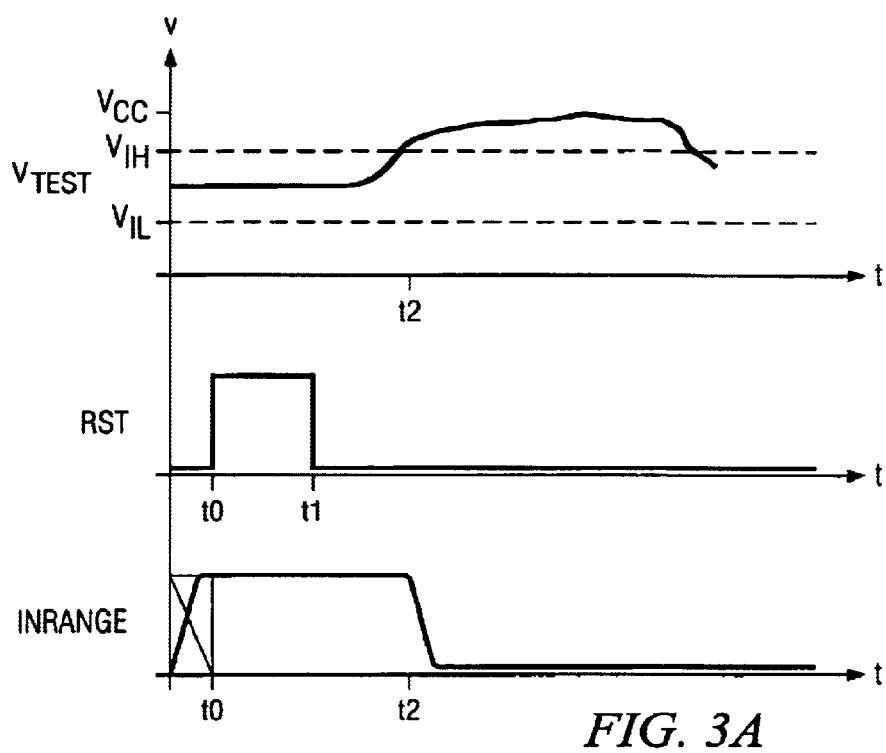
FIGS. 3A and 3B are waveform diagrams illustrating an operation of the detection circuit of FIG. 1.
Figure 3B:
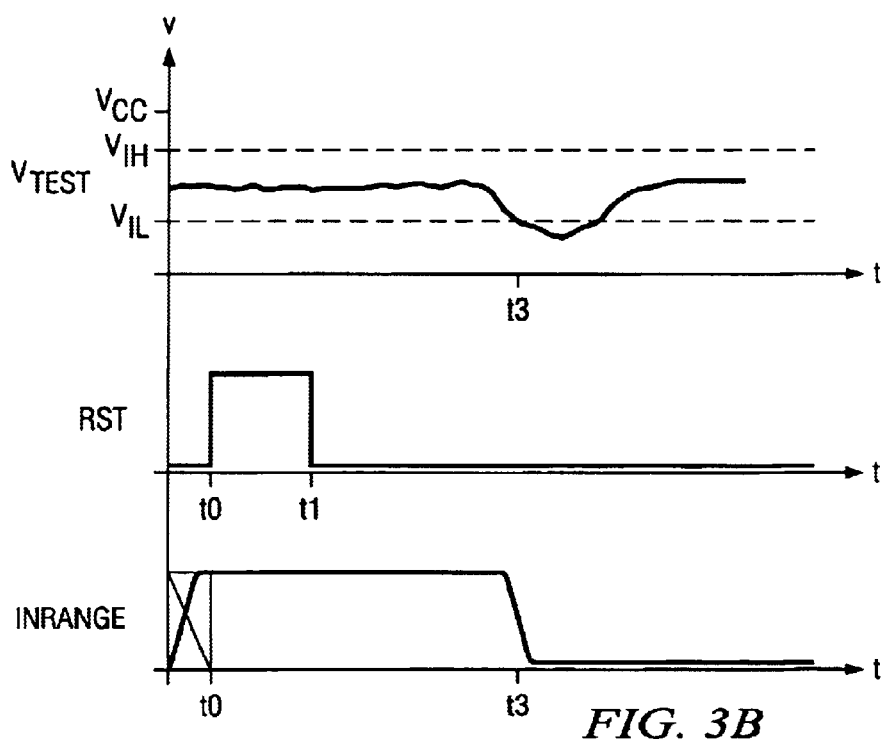

The operation of detection circuit 1 will be described with respect to FIGS. 3A and 3B. Initially, reset input signal RST is driven to a logic high state at time t0 to reset detection circuit 1. This activates pull-up transistor 4 and pull-down transistor 5, and deactivates transistors 7 and 8. At this point, the voltage appearing at the input of Schmitt trigger circuit 2A is at the high reference voltage level (Vcc), and the voltage appearing at the input of Schmitt trigger circuit 2B is at the low reference voltage level, such as ground. The output of Schmitt trigger circuit 2A is at a logic low state and the output of Schmitt trigger circuit 2B is at a logic high state, which causes output signal INRANGE to be at the logic high state.

At time t1, reset input signal RST is driven to a logic low state. This deactivates pull-up transistor 4 and pull-down transistor 5, and activates transistors 7 and 8. At this point, input signal Vtest is coupled to the input of Schmitt trigger circuits 2 such that detection circuit 1 is now capable of detecting the voltage appearing on input signal Vtest.

For exemplary reasons, it is assumed that input signal Vtest is at a voltage between input switching voltages Vih and Vil. In this case, the voltage of the input of Schmitt trigger circuits 2A and 2B is between the input switching voltages Vih and Vil. Because the voltage appearing at the input of Schmitt trigger circuit 2A drops from an initial reset level of the high reference voltage level (Vcc) to a voltage between input switching voltages Vih and Vil, the output of Schmitt trigger circuit 2A remains in the logic low state. Similarly, because the voltage appearing at the input of Schmitt trigger circuit 2B rises from an initial reset level of the low reference voltage level to a voltage between input switching voltages Vih and Vil, the output of Schmitt trigger circuit 2B remains in the logic high state. Consequently, output signal INRANGE remains in the logic high state.

In the event input signal Vtest rises above input switching voltage Vih at time t2 (depicted in FIG. 3A), the output of Schmitt trigger circuit 2B transitions to the logic low state, which causes output signal INRANGE to transition to the logic low state so as to indicate that input signal Vtest is no longer within the predetermined voltage range. Alternatively, in the event input signal Vtest falls below input switching voltage Vil (depicted in FIG. 3B), the output of Schmitt trigger circuit 2A transitions to the logic high state at time t3, which causes output signal INRANGE to transition to the logic low state so as to indicate that input signal Vtest is no longer within the predetermined voltage range. As can be seen, in either instance, output signal INRANGE remains in the logic low state until detection circuit 1 is reset using reset circuitry 3.

As stated above, detection circuit 1 may be employed in a memory device, such as a DRAM device, to monitor a reference generator therein and thereby ensure that the reference generator operates within acceptable limits. In this case, input switching voltages Vih and Vil may define the acceptable voltage range for the reference voltage provided by a reference generator.

Figure 4:
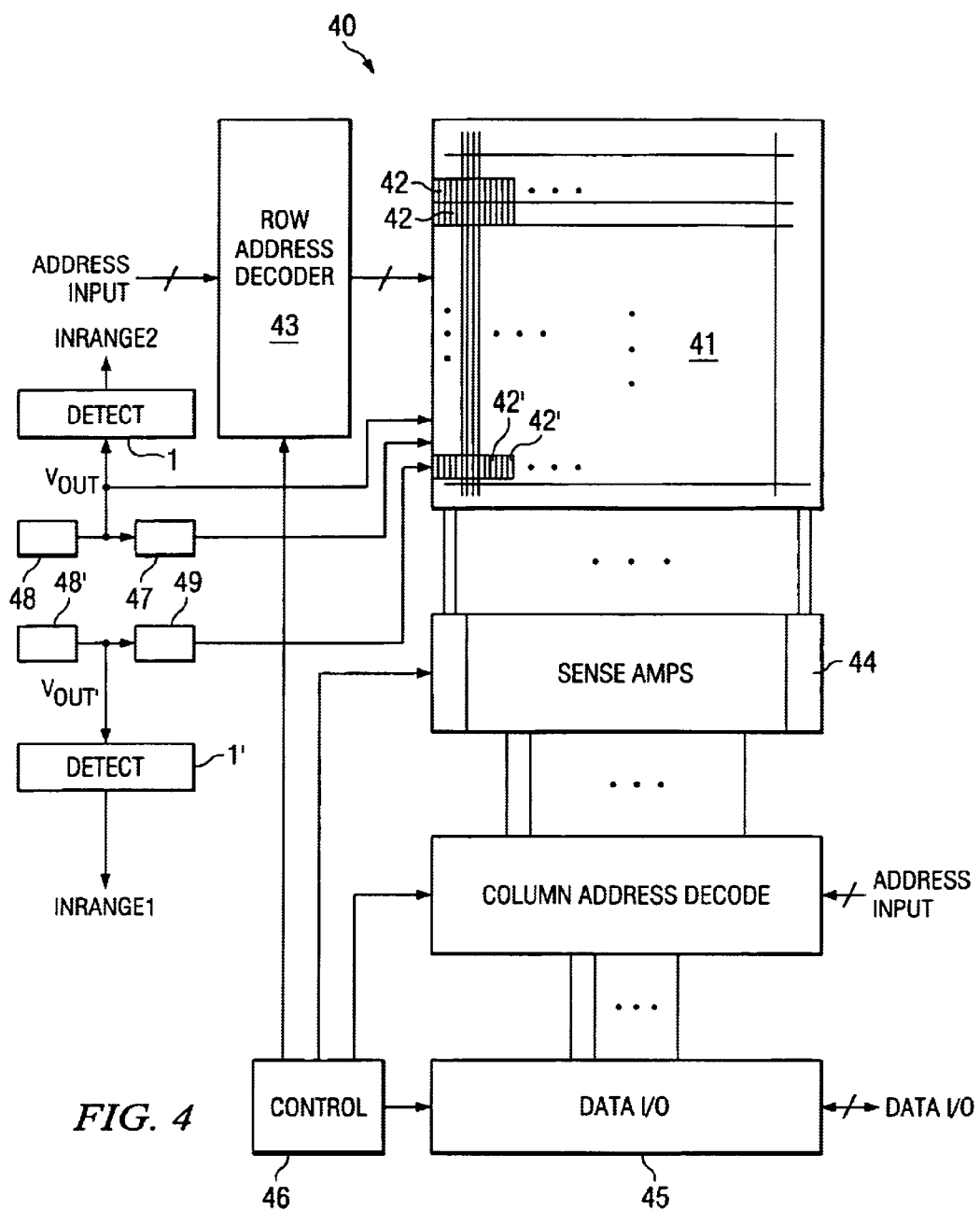
FIG. 4 is a memory device according to an exemplary embodiment of the present invention.

FIG. 4 is a block diagram of an exemplary memory device 40 in which detection circuit 1 may be employed. Memory device may be a volatile memory device, such as a static random access memory or a dynamic random access memory. It is understood, however, that memory device 40 may be a non-volatile memory.

Memory device 40 may include an array 41 of memory cells 42 arranged into rows and columns. Each row of memory cells 42 may be coupled to a distinct word line (not shown), and each column of memory cells 42 may be coupled to a distinct bit line (not shown). Memory cell array 41 may further include one or more reference cells 42' which are accessed during a memory access operation to determine the data value stored in an addressed memory cell 42. For exemplary reasons only, array 41 is shown in FIG. 4 as having a reference cell 42' coupled to each bit line in array 41. The use of reference memory cells 42' to facilitate a memory access operation is known in the art and will not be described in greater detail for reasons of simplicity.

Address decode circuitry 43 may receive an address input and select a row of memory cells 42 and at least one column of memory cells during a memory access operation. Sense amplifiers 44 may be coupled to the bit lines, sense the voltage levels appearing thereon and drive the bit lines to the high and low reference voltage levels based upon the voltage levels of the bit lines. Input/output circuitry 45 may couple selected bit line(s) to external data pins. Memory device 40 may further include control circuitry 46 which, in general terms, generates control and timing signals to effectuate memory access operations. The operation of memory cells 42, address decode circuitry 43, input/output circuitry 45 and control circuitry 46 is known and will not be described in detail for reasons of simplicity.

Memory device 40 may further include precharge circuitry 47 for precharging the bit lines of array 41 at the onset of a memory access operation. Precharge circuitry 47 may utilize a voltage reference generator 48 having an output Vout that is selectively coupled to the bit lines by precharge circuitry 47. It is understood that precharge circuitry 47 may be located within array 41. In addition, the output Vout of voltage reference generator 48 may be directly provided to memory cell array 41 so as to be connected to a plate of the cell capacitor (not shown) in each memory cell 42 in array 41. In this way, a single voltage reference generator 48 may be utilized to precharge the bit lines as well as to provide a reference plate voltage to each memory cell capacitor.

It is understood that precharge circuitry 47 may employ a different voltage reference generator 48 than the one employed to provide a reference potential to the memory cell capacitors.

Memory device 40 may further include a second voltage reference generator 48' which may be employed to provide an intermediate voltage level to be maintained in the reference memory cells 42'. Memory device 40 may include circuitry 49 for selectively providing the intermediate voltage level appearing at the output of the second voltage reference generator 48' to reference memory cells 42' during a memory access operation. Circuitry 49 may be located within memory cell array 41.

It is understood that memory device 40 may utilize voltage reference generator 48 for providing an intermediate voltage level to the reference memory cells 42' during memory access operations.

Because voltage reference generator 48 and second voltage reference generator 48' may provide a different intermediate voltage level, it is understood that voltage reference generator 48 and second voltage reference generator 48' may have different voltage ranges of acceptable voltage values. In this case, memory device 40 may include a separate detection circuit 1 for each voltage reference generator 48. Each detection circuit 1 may have it's transistors sized relative to each other so that the Vih and Vil of the detection circuit 1 define the acceptable voltage range for the corresponding voltage reference generator 48.

According to an exemplary embodiment of the present invention, the output Vout of voltage reference generator 48 may be coupled to the Vtest input of a first detection circuit 1. In this way, detection circuit 1 may effectively monitor the precharge voltage level of the bit lines and the plate potential of the memory cell capacitors, and detect when the output Vout is no longer within the acceptable range (defined between input switching voltages Vih and Vil). In addition, the output Vout' of the second voltage reference generator 48' may be coupled to the Vtest input of a second detection circuit 1'. In this way, second detection circuit 1' may effectively monitor the voltage level provided to the reference memory cells 42' and detect when the output Vout' is no longer within the acceptable range (defined between input switching voltages Vih' and Vil').

Figure 5:
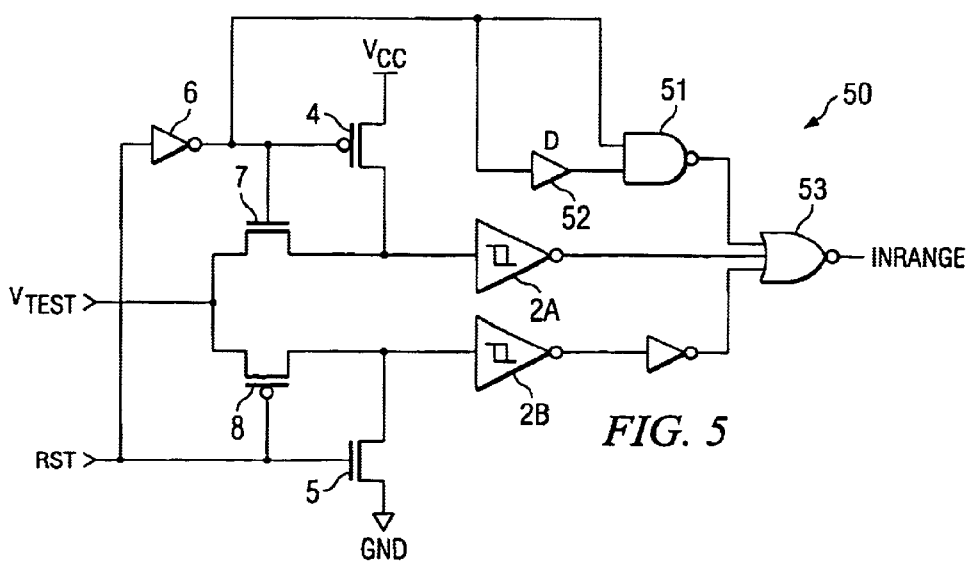
FIG. 5 is a schematic diagram of a detection circuit according to a second exemplary embodiment of the present invention.

FIG. 5 is a schematic diagram of a detection circuit 50 according to another exemplary embodiment of the present invention. Detection circuit 50 may be configured for a synchronous system/memory device. Detection circuit 50 may include the same Schmitt trigger circuits 2 and reset circuitry 3 as shown in FIG. 1 and described above. In addition, detection circuit 50 may include circuitry to synchronize output signal INRANGE to a clock signal and/or to reset input signal RST that has been previously synchronized to a clock signal. Detection circuit 50 may include a logic NAND gate 51 having an input coupled to the logical inversion of reset input signal RST. Detection circuit 50 may further include a delay circuit 52 having an input coupled to the logical inversion of reset input signal RST and an output coupled to an input of logic NAND gate 51. The propagation delay through delay circuit 52 is set to be greater than the propagation delay through Schmitt trigger circuits 2. The output of logic NAND gate 51 is coupled to a third input of logic gate 53, which includes inputs coupled to the output of Schmitt trigger circuits 2A and 2B. Logic NAND gate 51 and delay circuit 52 cause output signal INRANGE to go to a logic low state upon reset input signal RST transitioning to a logic high state to perform a reset operation. Output signal INRANGE remains in the logic high state during the time reset input signal RST is at the logic high state. When reset input signal RST transitions to a logic low state to allow detection circuit 1 to monitor the voltage appearing on input signal Vout, output signal INRANGE may transitions to a logic high state only after a delay comparable to at least the delay through delay circuit 52. With the delay through delay circuit 52 being greater than the delay through Schmitt trigger circuits 2, output signal INRANGE may remain in the logic low state if the voltage of input signal Vout is not initially in the acceptable voltage range, due to one of Schmitt trigger circuits 2 driving an input of logic gate 53 to a logic high state.

A benefit of the detection circuits described above is that the circuits track variations in the supply voltage and/or high reference voltage (Vcc) better than supply-insensitive bandgap circuits typically used in conventional test circuitry.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A voltage level detection circuit, comprising:
   a first and a second Schmitt trigger circuit, an input of the voltage level detection circuit being coupled to an input of the first and the second Schmitt trigger circuits;
   reset circuitry coupled between the input of the voltage level detection circuit and the input of the first and second Schmitt trigger circuits, for selectively placing the input of the first Schmitt trigger circuit at a first predetermined voltage level and the input of the second Schmitt trigger circuit at a second predetermined voltage level; and
   output circuitry coupled to an output of the first and second Schmitt trigger circuits, for generating an output signal having a value indicative of whether the voltage level appearing on the input of the voltage level detection circuit is no longer within a predetermined range of voltage levels.

2. The voltage level detection circuit of claim 1, wherein the first predetermined voltage level is a voltage level representative of a logic high value.

3. The voltage level detection circuit of claim 1, wherein the first predetermined voltage level is a voltage level representative of a logic low value.

4. The voltage level detection circuit of claim 2, wherein the second predetermined voltage level is a voltage level representative of a logic high value.

5. The voltage level detection circuit of claim 1, wherein:
   the voltage level detection circuitry includes a reset input signal; and
   the reset circuitry comprises:
      a pull-up device coupled between a high reference voltage level and the input of the first Schmitt trigger circuit, the pull-up device being selectively activated based upon a value of the reset input signal; and
      a pull-down device coupled between a low reference voltage level and the input of the second Schmitt trigger circuit, the pull-down device being selectively activated based upon a value of the reset input signal.

6. The voltage level detection circuit of claim 5, wherein:
   the pull-up device and pull-down device each comprises a transistor, a control terminal of each transistor being coupled to the reset input signal so as to be activated at substantially the same time.

7. The voltage level detection circuit of claim 1, wherein the reset circuitry comprises a transmission gate transistor coupled between the input of the voltage level detection circuit and the input of the first Schmitt trigger circuit and activated so that the input of the voltage level detection circuit is isolated from the input of the first Schmitt trigger circuit during the time the reset circuitry places the first predetermined voltage level on the input of the first Schmitt trigger circuit, and connected to the input of the first Schmitt trigger circuit during the time the reset circuitry is disabled from placing the first predetermined voltage level on the input of the first Schmitt trigger circuit.

8. The voltage level detection circuit of claim 7, wherein the reset circuitry comprises a second transmission gate transistor coupled between the input of the voltage level detection circuit and the input of the second Schmitt trigger circuit and activated so that the input of the voltage level detection circuit is isolated from the input of the second Schmitt trigger circuit during the time the reset circuitry places the second predetermined voltage level on the input of the second Schmitt trigger circuit and connected to the input of the second Schmitt trigger circuit during the time the reset circuitry is disabled from placing the second predetermined voltage level on the input of the second Schmitt trigger circuit.

9. The voltage level detection circuit of claim 1, wherein the voltage level detection circuit includes a reset signal, and the voltage level detection circuit further comprises circuitry for substantially synchronizing the output signal to the reset signal.

10. The voltage level detection circuit of claim 1, wherein the output circuitry comprises logic circuitry having a first input coupled to the output of the first Schmitt trigger circuit and a second input coupled to the output of the second Schmitt trigger circuit.

11. A memory device, comprising:
   an array of memory cells, the array of memory cells including at least one bit line coupled to a column of memory cells;
   address decode circuitry for receiving an address input and selecting at least one memory cell corresponding to the value of the address input during a memory access operation;
   data input/output circuitry for selectively coupling the at least one bit line to a data input/output of the memory device during the memory access operation;
   a reference voltage generator circuit for generating at its output a predetermined intermediate reference voltage level;
   a detect circuit coupled to the reference voltage generator circuit output for determining whether the predetermined intermediate reference voltage level is maintained within a predetermined voltage range, comprising:
      a first Schmitt trigger circuit having an input coupled to the output of the reference voltage generator circuit, for detecting the predetermined intermediate reference voltage level output of the reference voltage generator circuit falling below a first predetermined voltage level; and
      a second Schmitt trigger circuit having an input coupled to the output of the reference voltage generator circuit, for detecting the predetermined intermediate reference voltage level output of the voltage generator circuit rising above a second predetermined voltage level.

12. The memory device of claim 11, wherein the detect circuit further comprises:
   output circuitry coupled to an output of the first and the second Schmitt trigger circuits, for generating an output signal having a value indicative of the detections by the first and second Schmitt trigger circuits.

13. The memory device of claim 11, wherein the detect circuit further comprises:
   reset circuitry coupled between the output of the reference voltage generator circuit and an input of the first and second Schmitt trigger circuits, for selectively placing the input of the first Schmitt trigger circuit at a first logic value and the input of the second Schmitt trigger circuit at a second logic value.

14. The memory device of claim 13, wherein the first logic value is a logic high value.

15. The memory device of claim 13, wherein the second logic value is a logic low value.

16. The memory device of claim 13, wherein:
   the memory device includes a reset signal; and
   the reset circuitry comprises:
      a pull-up device coupled between a high reference voltage level and the input of the first Schmitt trigger circuit, the pull-up device being selectively activated based upon a value of the reset signal; and
      a pull-down device coupled between a low reference voltage level and the input of the second Schmitt trigger circuit, the pull-down device being selectively activated based upon a value of the reset input signal.

17. The memory device of claim 16, wherein:
   the pull-up device and pull-down device each comprises a transistor, a control terminal of each transistor being coupled to the reset input signal so as to be activated at substantially the same time.

18. The memory device of claim 13, wherein the reset circuitry comprises a transmission gate transistor coupled between the reference voltage generator circuit and the input of the first Schmitt trigger circuit and activated so that the voltage generator circuit is isolated from the input of the first Schmitt trigger circuit during the time the reset circuitry places the first logic value on the input of the first Schmitt trigger circuit and connected to the input of the first Schmitt trigger circuit during the time the reset circuitry is disabled from placing the first logic value on the input of the first Schmitt trigger circuit.

19. The memory device of claim 18, wherein the reset circuitry comprises a second transmission gate transistor coupled between the reference voltage generator circuit and the input of the second Schmitt trigger circuit and activated so that the voltage generator circuit is isolated from the input of the second Schmitt trigger circuit during the time the reset circuitry places the second logic value on the input of the second Schmitt trigger circuit and connected to the input of the second Schmitt trigger circuit during the time the reset circuitry is disabled from placing the second logic value on the input of the second Schmitt trigger circuit.

20. The memory device of claim 12, wherein the output circuitry comprises logic circuitry having a first input coupled to the output of the first Schmitt trigger circuit and a second input coupled to the output of the second Schmitt trigger circuit.

21. The memory device of claim 11, wherein the first and second Schmitt trigger circuits each comprises:
   a pair of series-connected p-channel transistors;
   a pair of series-connected n-channel transistors connected in series with the pair of series-connected p-channel transistors;
   a p-channel transistor having a drain coupled to the pair of series-connected p-channel transistors, a source coupled to a low reference voltage level and a gate coupled to an output of the Schmitt trigger circuit; and
   an n-channel transistor having a source coupled to the pair of series-connected n-channel transistors, a drain coupled to a high reference voltage level and a gate coupled to the output of the Schmitt trigger circuit.

22. The memory device of claim 11, wherein the detect circuit further comprises a reset signal and circuitry for substantially synchronizing an output signal of the detect circuit to the reset signal.

23. A voltage detection circuit for a memory device, comprising:
   a first Schmitt trigger circuit; and
   reset circuitry coupled between an input of the voltage detection circuit and an input of the first Schmitt trigger circuit, for selectively driving the input of the first Schmitt trigger circuit to a predetermined voltage level while isolating the input of the voltage detection circuit from the input of the first Schmitt trigger circuit.

24. The voltage detection circuit of claim 23, wherein the reset circuitry comprises:
   a first transistor coupled between the input of the first Schmitt trigger circuit and a reference voltage, a control terminal of the first transistor being coupled to a control signal; and
   a second transistor coupled between the input of the first Schmitt trigger circuit and the input of the voltage detection circuit, a control terminal of the second transistor being coupled to the control signal.

25. The voltage detection circuit of claim 24, wherein the first transistor is a pull-up transistor.

26. The voltage detection circuit of claim 24, wherein the first transistor is a pull-down transistor.

27. The voltage detection circuit of claim 23, further comprising:
   a second Schmitt trigger circuit having an input coupled to the input of the voltage detection circuit, the reset circuitry selectively places a second predetermined voltage level on the input of the second Schmitt trigger circuit while isolating the input of the voltage detection circuit from the input of the second Schmitt trigger circuit.

28. The voltage detection circuit of claim 27, further comprising:
   output circuitry having inputs coupled to outputs of the first and second Schmitt trigger circuits and an output having a value indicative of whether a voltage level appearing on the input of the voltage detection circuit is no longer within a range of voltages.

29. The voltage detection circuit of claim 28, wherein the range of voltages is defined by an input switching threshold voltage of the first Schmitt trigger circuit and an input switching threshold voltage of the second Schmitt trigger circuit.

30. A voltage detection circuit for use in a memory device, for determining whether an intermediate reference voltage is maintained within a predetermined voltage range, comprising:
   a first Schmitt trigger circuit having an input coupled to the intermediate reference voltage, for detecting the intermediate reference voltage falling below a first predetermined voltage level; and
   a second Schmitt trigger circuit having an input coupled to the intermediate reference voltage, for detecting the intermediate reference voltage rising above a second predetermined voltage level, the predetermined voltage range being defined by input switching thresholds of the first and second Schmitt trigger circuits.

31. A voltage level detection circuit, comprising:
   a circuit input that receives a test voltage signal;
   a first and a second threshold circuit each having an input;
   a reset circuit coupled between the circuit input and the inputs of the first and second threshold circuits, the reset circuit including an isolation circuit having a first mode which couples the test voltage signal from the circuit input to both the first and second threshold circuit inputs and a second mode which isolates the circuit input from both the first and second threshold circuit inputs, and further including a circuit that places first and second threshold circuit inputs at first and second predetermined voltage levels, respectively, when the isolation circuit is in the second mode; and
   an output circuit coupled to an output of the first and second threshold circuits to generate an output signal having a value indicative of whether the test voltage signal is outside a predetermined voltage level range defined by the first and second threshold circuits.

32. A voltage level detection circuit, comprising:
   a circuit input that receives a test voltage signal;
   a threshold circuit having an input; and
   a reset circuit coupled between the circuit input and the threshold circuit input, the reset circuit including:
      an isolation circuit having a first mode which couples the test voltage signal from the circuit input to the threshold circuit input and a second mode which isolates the circuit input from the threshold circuit input; and
      a circuit that places the threshold circuit input at a predetermined voltage level when the isolation circuit is in the second mode.

33. A voltage level detection circuit, comprising:
   a circuit input that receives a test voltage signal;
   a first and a second threshold circuit each having an input; and
   a reset circuit coupled between the circuit input and the inputs of the first and second threshold circuits, the reset circuit including:
      an isolation circuit having a first mode which couples the test voltage signal from the circuit input to both the first and second threshold circuit inputs and a second mode which isolates the circuit input from both the first and second threshold circuit inputs, and
      a circuit that places first and second threshold circuit inputs at first and second predetermined voltage levels, respectively, when the isolation circuit is in the second mode.

34. A voltage detection circuit for use in a memory device, comprising:
   a reference voltage generator that generates an intermediate reference voltage;
   a first threshold circuit having an input coupled to receive the intermediate reference voltage and operating to detect whether the intermediate reference voltage falls below a first predetermined voltage level and output a first threshold signal indicative thereof; and
   a second threshold circuit having an input also coupled to receive the intermediate reference voltage and operating to detect whether the intermediate reference voltage rises above a second predetermined voltage level and output a second threshold signal indicative thereof; and
   an output circuit that combines the first and second threshold signals to generate an output signal indicative of whether the intermediate reference voltage is outside a predetermined voltage range defined by the first and second predetermined voltage levels.

35. The circuit of claim 34, further comprising:
   a reset circuit coupled between the reference voltage generator and the inputs of the first and second threshold circuits, the reset circuit including:
      an isolation circuit having a first mode which couples the intermediate reference voltage to both the first and second threshold circuit inputs and a second mode which isolates the intermediate reference voltage from both the first and second threshold circuit inputs.

36. The circuit of claim 35, wherein the reset circuit further comprises:
   a circuit that places first and second threshold circuit inputs at first and second predetermined voltage levels, respectively, when the isolation circuit is in the second mode.

* * * * *